(12) United States Patent
Schroeder

(10) Patent No.: US 12,006,587 B2
(45) Date of Patent: Jun. 11, 2024

(54) HIGHLY MAGNETICALLY PERMEABLE ALLOY DEPOSITION METHOD FOR MAGNETIC SENSORS

(71) Applicant: Mark R. Schroeder, Hollister, CA (US)

(72) Inventor: Mark R. Schroeder, Hollister, CA (US)

(*) Notice: Subject to any disclaimer, the term of this patent is extended or adjusted under 35 U.S.C. 154(b) by 0 days.

(21) Appl. No.: 17/180,670

(22) Filed: Feb. 19, 2021

(65) Prior Publication Data

US 2021/0254233 A1  Aug. 19, 2021

Related U.S. Application Data

(60) Provisional application No. 62/978,734, filed on Feb. 19, 2020.

(51) Int. Cl.
| | |
|---|---|
| *C25D 3/56* | (2006.01) |
| *C03C 15/00* | (2006.01) |
| *C03C 17/10* | (2006.01) |
| *C25D 5/00* | (2006.01) |
| *C25D 5/02* | (2006.01) |
| *C25D 5/20* | (2006.01) |
| *C25D 5/54* | (2006.01) |
| *C25D 7/00* | (2006.01) |

(Continued)

(52) U.S. Cl.
CPC .............. *C25D 3/562* (2013.01); *C03C 15/00* (2013.01); *C03C 17/10* (2013.01); *C25D 5/009* (2020.08); *C25D 5/022* (2013.01); *C25D 5/20* (2013.01); *C25D 5/54* (2013.01); *C25D 7/00* (2013.01); *C25D 21/10* (2013.01); *G01R 33/07* (2013.01); *G01R 33/096* (2013.01); *H01F 1/055* (2013.01); *C03C 2217/261* (2013.01); *C03C 2217/27* (2013.01); *C03C 2218/115* (2013.01); *C03C 2218/31* (2013.01); *C03C 2218/34* (2013.01)

(58) Field of Classification Search
CPC .......... G01R 15/202; G01R 33/07–077; G01R 33/06–10; G01R 15/20–207; C25D 5/007; C25D 5/009; C25D 5/20; C25D 3/562
See application file for complete search history.

(56) References Cited

U.S. PATENT DOCUMENTS 3,888,744 A * 6/1975 Stromatt .................. C25D 3/56
                                                          205/148
4,129,482 A * 12/1978 Lash ...................... C25D 3/562
                                                          205/260

(Continued)

OTHER PUBLICATIONS

Brenner, Electrodeposition of Alloys, Principle and Practice, 1963, pp. 242-245, 266-279, 290-305, vol. II, Academic Press, New York and London.

*Primary Examiner* — Hosung Chung

(74) *Attorney, Agent, or Firm* — Spectrum IP Law Group LLC

(57) ABSTRACT

In one example, a method to manufacture a magnetic sensor, comprises providing an electrolyte solution, submersing a substrate in the electrolyte solution, submersing a plurality of ingots in the electrolyte solution, wherein the ingots comprises a metal that is magnetic, and depositing the metal on the substrate by applying a voltage between the metal ingot and the substrate to result in magnetic alloy layer on the substrate. Other examples and related methods are also disclosed herein.

17 Claims, 3 Drawing Sheets

(51) Int. Cl.
*C25D 21/10* (2006.01)
*G01R 33/07* (2006.01)
*G01R 33/09* (2006.01)
*H01F 1/055* (2006.01)

(56) References Cited

U.S. PATENT DOCUMENTS

| | | | | |
|---|---|---|---|---|
| 4,461,680 A | * | 7/1984 | Lashmore | C25D 5/627 |
| | | | | 204/DIG. 9 |
| 6,496,004 B1 | * | 12/2002 | Nguyen Van Dau | B82Y 25/00 |
| | | | | 324/252 |
| 2008/0151615 A1 | * | 6/2008 | Rodmacq | G01R 33/0325 |
| | | | | 204/192.15 |
| 2010/0231211 A1 | * | 9/2010 | Edelstein | G01D 1/00 |
| | | | | 324/244 |
| 2011/0042223 A1 | * | 2/2011 | Kruglick | C25D 5/009 |
| | | | | 204/229.4 |
| 2014/0216940 A1 | * | 8/2014 | Wang | C25D 7/123 |
| | | | | 205/137 |
| 2014/0347046 A1 | * | 11/2014 | Bahr | G01R 33/07 |
| | | | | 324/251 |
| 2017/0271575 A1 | * | 9/2017 | Hioka | G01R 33/07 |
| 2019/0006099 A1 | * | 1/2019 | Kobayashi | B29C 70/62 |

\* cited by examiner

HIGHLY MAGNETICALLY PERMEABLE ALLOY DEPOSITION METHOD FOR MAGNETIC SENSORS

CROSS-REFERENCE TO RELATED APPLICATIONS

The present application claims the benefit of U.S. Provisional Application No. 62/978,734 filed Feb. 19, 2020. Said Application No. 62/978,734 is hereby incorporated herein by reference in its entirety.

BACKGROUND

Magnetic sensors are used in a myriad of applications as they can detect not only distance from a magnetic source but also its direction. This direction, however, is not isotropic in that output from the device is identical on the "front" side of the device to its back, over a 180 degree rotation. This is not necessarily a limitation as Hall Effect Sensors are 360 degree capable but could be used as a beneficial feature.

The industry standard for producing a metallic high permeability layer suitable for sensing applications was with vacuum deposition. Very high levels of vacuum are typically necessary to avoid contamination, as well as other reasons. These vacuum levels are typically in the $10^{-6}$ to $10^{-8}$ torr base vacuum level. Physical Vapor Deposition or DC sputtering technology is typically used, where an electron beam incident on a target material of high purity evaporates the material into a plume which then deposits onto the desired substrate.

In addition to the cost of the high vacuum equipment and the reduced throughput from such processes, there are numerous other problems with the process which make its cost relatively prohibitive. These costs prevent manufacturers from entering the market and allow only large established organizations to produce, and hence corner the market, of high quality Anisotropic Magnetoresistive (AMR) Sensors. Around the vacuum equipment is not only a large number of pieces of support equipment, but also the facilities and surrounding manufacturing environment must be semiconductor-grade clean. These facts add to the expense. The complication of the process, the dangers thereof, the toxicity and flammability of process gasses, etc., all require specifically trained, high echelon personnel for operation, support, and management of the entire process environment.

The most basic cost-additive part of the canonical industrial process of the age is pushed by the necessity to reorient the molecular structure of the metal atoms in the deposited film following said deposition. This post-process involves an annealing in high purity hydrogen at elevated temperatures for long time frames, for example 2-3 days. This is complicated further by the necessity of changes in temperature, for example from room temperature after loading, and the reverse, needing to be done at rates slower than about one degree Celsius (C) per minute. Because a typical annealing temperature can be above 500 degrees C., even the temperature ramping phase of the post-process can be time consuming and costly.

DESCRIPTION OF THE DRAWING FIGURES

Claimed subject matter is particularly pointed out and distinctly claimed in the concluding portion of the specification. However, such subject matter may be understood by reference to the following detailed description when read with the accompanying drawings in which:

Figure 1:
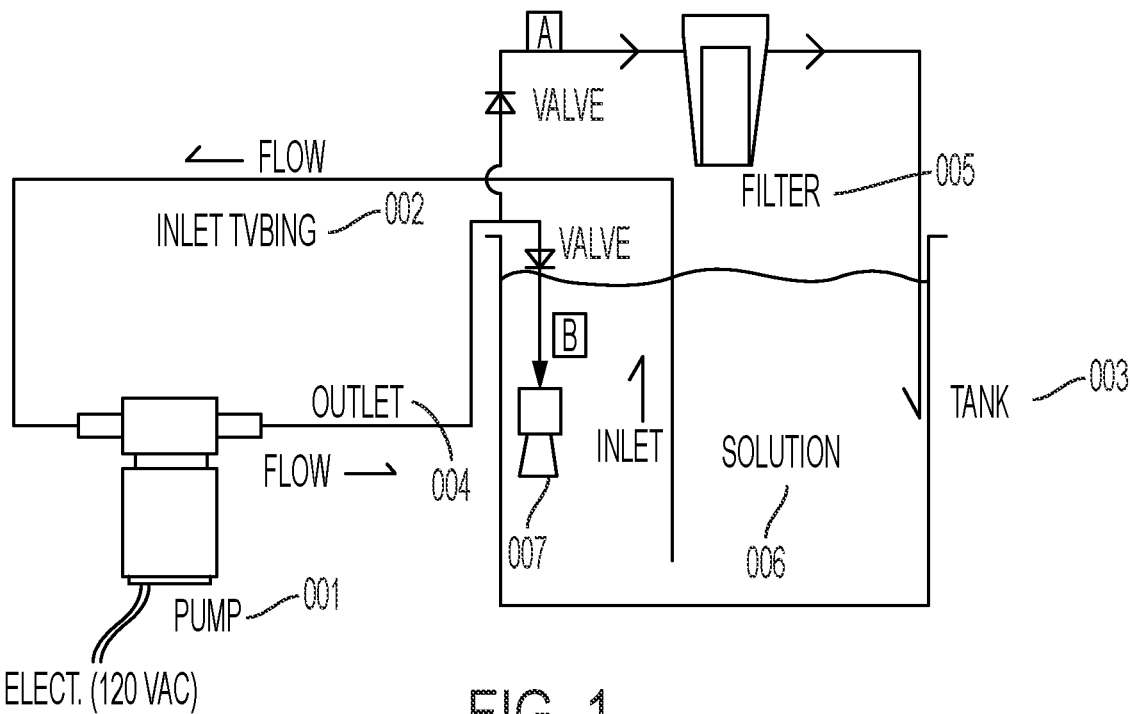
FIG. 1 is a diagram of the flow of electrolyte in accordance with one or more embodiments.

It will be appreciated that for simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

In the following detailed description, numerous specific details are set forth to provide a thorough understanding of claimed subject matter. It will, however, be understood by those skilled in the art that claimed subject matter may be practiced without these specific details. In other instances, well-known methods, procedures, components and/or circuits have not been described in detail.

In the following description and/or claims, the terms coupled and/or connected, along with their derivatives, may be used. In particular embodiments, connected may be used to indicate that two or more elements are in direct physical and/or electrical contact with each other. Coupled may mean that two or more elements are in direct physical and/or electrical contact. However, coupled may also mean that two or more elements may not be in direct contact with each other, but yet may still cooperate and/or interact with each other. For example, "coupled" may mean that two or more elements do not contact each other but are indirectly joined together via another element or intermediate elements. Finally, the terms "on," "overlying," and "over" may be used in the following description and claims. "On," "overlying," and "over" may be used to indicate that two or more elements are in direct physical contact with each other. It should be noted, however, that "over" may also mean that two or more elements are not in direct contact with each other. For example, "over" may mean that one element is above another element but not contact each other and may have another element or elements in between the two elements. Furthermore, the term "and/or" may mean "and", it may mean "or", it may mean "exclusive-or", it may mean "one", it may mean "some, but not all", it may mean "neither", and/or it may mean "both", although the scope of claimed subject matter is not limited in this respect. In the following description and/or claims, the terms "comprise" and "include," along with their derivatives, may be used and are intended as synonyms for each other.

Referring now to FIG. 1, a diagram of the flow of electrolyte to form an advanced magnetic sensor in accordance with one or more embodiments will be discussed. As shown in FIG. 1, flow of electrolyte to form an advanced magnetic sensor can be achieved with pump 001, inlet tubing 002, valves A and B, tank 003, outlet 004, filter 005, solution 006, and nozzle 007. An advanced magnetic sensor would supersede any semiconductor-based sensor, such as a Hall Effect sensor, through the use of a metallic alloy deposition on an insulating or near insulating surface. The metallic alloy deposited by the process delineated herein is far more sensitive to fields than the semiconductor sensor, perhaps at least 100×. It can be achieved with a co-deposition of Nickel and Iron in approximately 80% to 20% atomic numerical quantities. This is performed, as per the purposes herein, at nearly room temperature, with no further processing beyond packaging, specifications provided below. The process delineated herein, having been reduced to practice, has proven to meet or exceed the specifications of sensors created using the canonical process that is current art. It is not only easier, faster, cheaper, and requiring only simple and less costly equipment, but is also superior after only a single process step.

The process delineated herein produces a metal layer that is the primary element in an advanced magnetic sensor. This process has been designed, and subsequently exhaustively experimented on, to produce an alloy material which is already molecularly optimized for high magnetic permeability. The permeability obtained has been shown to meet or exceed, sometimes by as much as about 5-7%, permalloy alloys from canonical processes. By way of example, current Fe/Ni alloys (e.g., Permalloy) can have relative magnetic permeabilities of nearly 100,000. Relatively pure (99.5-99.9%) Fe, that has not been hydrogen annealed for molecular structure enhancement), has a permeability of about 5,000. Permalloy and its derivatives are the industry standard for anisotropic magnetoresistive (AMR) sensor materials. Additional gains in sensitivity without increasing noise can be obtained by some measures delineated below as part of other embodiments disclosed herein. Magnetic permeability (mu) of layers deposited using the methods described herein, have reached repeatable levels of 112,120 (+/−125). Note that relative permeability (as above) is dimensionless since it is in a ratio with the permeability of free space of $4*Pi*10^-7$ Henrys/meter.

At temperatures of between about 25 degrees Celsius (C) to about 50 degrees C., the nickel-iron (Ni—Fe) alloy is electrodeposited in an electrolyte "bath" that contains regular aqueous components, are simple acidic salt baths, and use ingots of the raw materials (Ni and Fe) as anodes. The substrate, immersed in the bath, is the cathode as it is at a negative charge. It is noted below that the process can be made in accordance with procedures done by one of ordinary skill in the art somewhat insensitive to changes in pH, temperature, molarity of materials, and other factors due to the statistical nature of an aqueous bath process. This insensitivity is mean well within the bounds of reason, however, as significant experimentation was necessary to determine the limits.

For electrodeposition, a substrate must be at least minimally conductive. Either doped silicon wafers or glass substrates are used. Note that as discussed below there is included instruction on plastics, elastomers, and other flexible substrates. The glass is treated first with a comparatively safe etchant as hydrofluoric (HF) acid is viewed as a very dangerous chemical. Examples can include Sodium Fluoride (NaF$_3$), Ammonium Fluoride, and Hydrofluorosilicic Acid, etc. This is done for five minutes at room temperature to micro-roughen the glass surface to enhance adherence of the eventual metal deposition. It has no observed effect on an intervening layer.

A Chemical Bath Deposition (CBD) can be performed on glass to achieve a very slight conductivity. This is done to prevent underlying layers from interfering electrically with the sensing magnetic layer. It can be performed by other techniques than are mentioned above, but the CBD is well known and has been used in this example. Hence, the subject matter herein is not limited in scope by examples chosen for utility, safety, and/or efficacy. In addition, embodiments herein are not limited by the material used for the underlying layer, as there are many low conductivity materials that could be used, but simply not chosen in this example. Herein a deposition of about 50 nanometers (nm) to about 150 nm of lead sulfide (PbS) can be deposited electrolessly. Note that this same process can be used virtually identically to make flexible substrates, such as plastics or elastomers, conductive, so that the sensing material described can subsequently be deposited using these methods. For comparison, flexible substrates cannot be used in traditional or current AMR methods due to their outgassing tendencies in vacuum as well as their inability to withstand temperature and pressure conditions of annealing or other processes involved.

Patterns can be deposited, exposed, and developed using standard albeit "thick" photoresist techniques. The term "thick" can be used since today's semiconductor technology often, due to device size reduction, uses sub-micron photoresist layers. To prevent metallic growth in our bath process except in device regions, we have typically spun out about 15 microns to about 30 microns of specialized resist. The remainder of this process is as per the photoresist (PR) manufacturer's recommendations.

Figure 2:
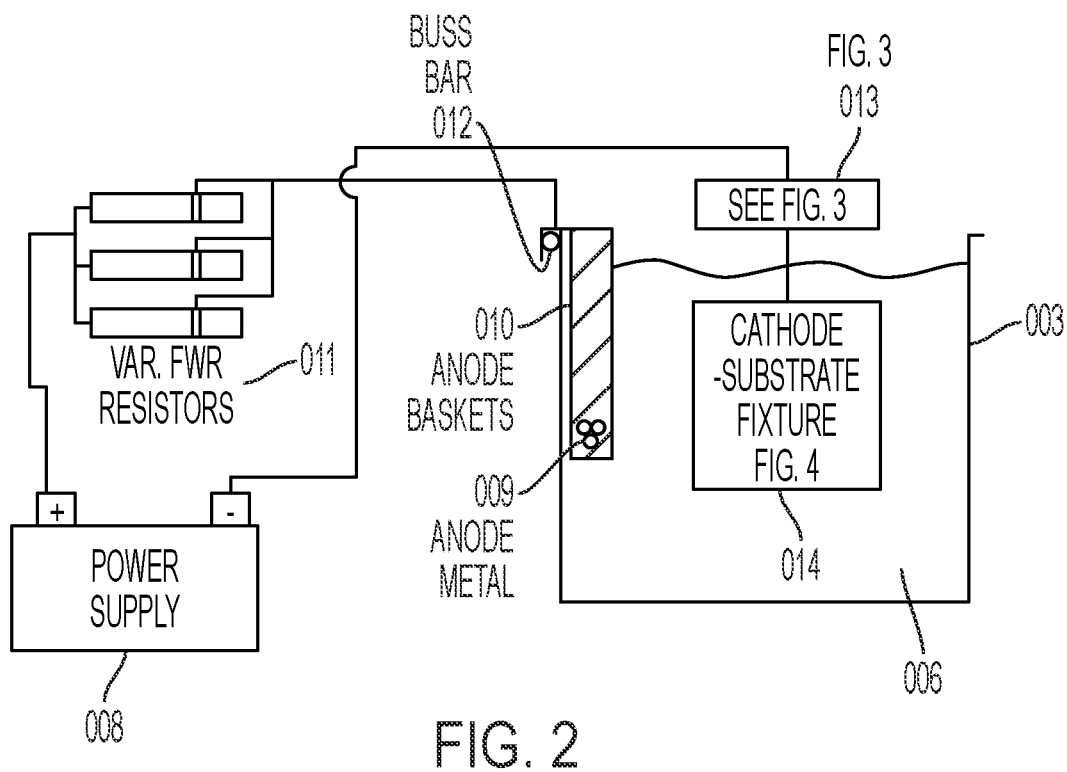
FIG. 2 is a diagram of a power supply in accordance with one or more embodiments.

Referring now to FIG. 2, a diagram of a power supply in accordance with one or more embodiments will be discussed. As shown in FIG. 2, the anode terminal of power supply 008 can be coupled with anode metal 009 and anode baskets 010 via one or more power resistors 011 and bus bar 012. The cathode terminal of power supply 007 can be coupled with a rotation mechanism 013 as shown in FIG. 3 and cathode substrate fixture 014 ash shown in FIG. 4, which can be submersed in solution 006 contained in tank 003.

Ingots of pure Ni, and cast Fe, can be placed in independent titanium (Ti) baskets. Titanium can be used due to its lack of interactivity in the process due to the Galvanic Series. These baskets can be placed at the same positive (+) potential from the "+" side of a current-controlled power supply. The substrate is attached, electrically and physically, to the cathode, which, in this example, is a titanium fixture with Ti "clips", attached by Ti screws, to the Ti fixture. The fixture, in turn, is attached above the bath to an electromechanical means of rotation, while simultaneously maintaining electrical connectivity. This can be achieved in several ways, but in this example, where embodiments herein are in no way limited, any rotation, even if necessary, typically can be obtained with the use of a fixed housing with carbon brushes spring-pressured onto a rotating copper center to which the cathode is attached.

Figure 3:
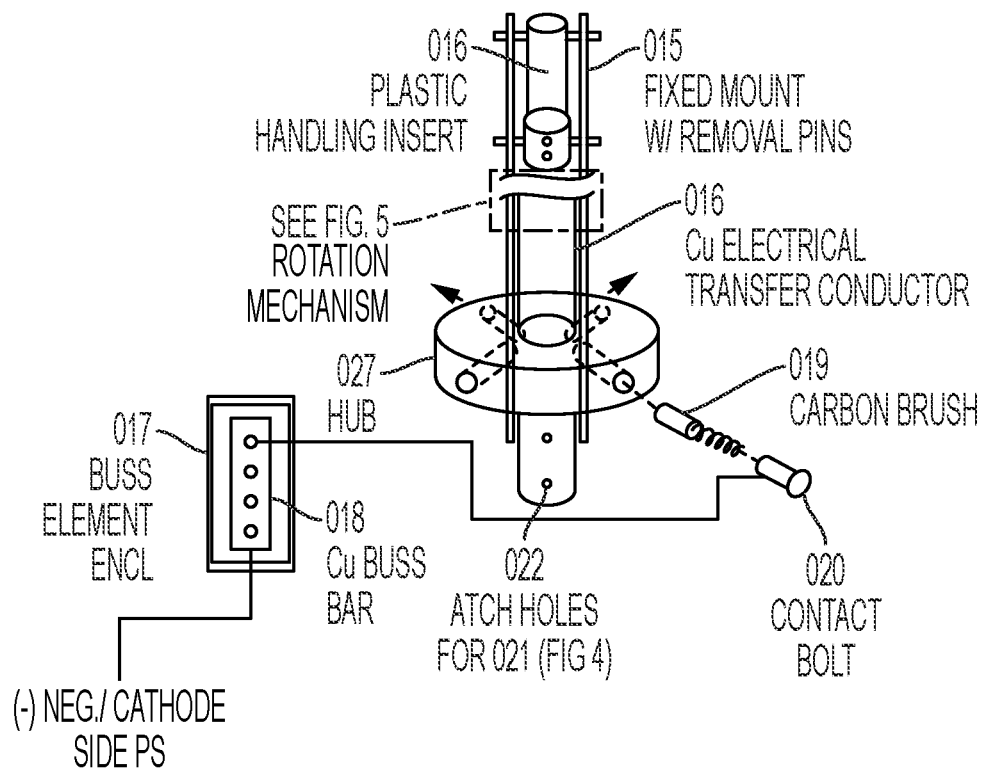
FIG. 3 is a diagram of rotation and electric charge and/or current transfer in accordance with one or more embodiments.

Referring now to FIG. 3, a diagram of rotation and electric charge and/or current transfer in accordance with one or more embodiments will be discussed. The rotation mechanism 013 can include a fixed mount 015 with removal pins, a plastic handling insert 016a and a Cu electrical transfer conductor 016b, a buss element enclosure 017, a Cu buss bar 018, a carbon brush 019, contact bolt 020, attach holes 022 for fixture 021 of FIG. 4, and a hub 027. A rotation mechanism as shown in FIG. 5 is coupled to hub 027.

Figure 4:
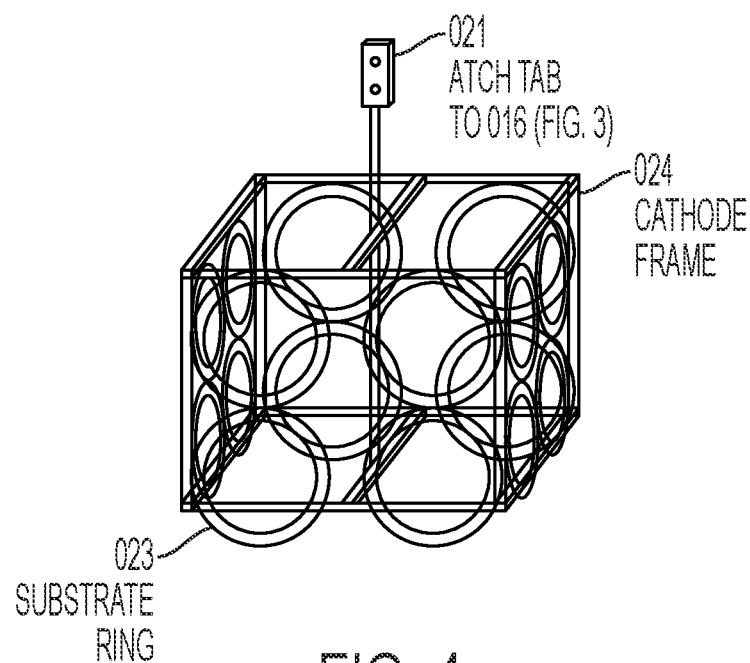
FIG. 4 is a diagram of a cathode substrate fixture in accordance with one or more embodiments.

Referring now to FIG. 4, a diagram of a cathode substrate fixture in accordance with one or more embodiments will be discussed. As shown in FIG. 4, a cathode substrate fixture includes a cathode frame 024, substrate rings 023, and an attach tab 021 to attached to plastic handling insert 016 of FIG. 3.

Figure 5:
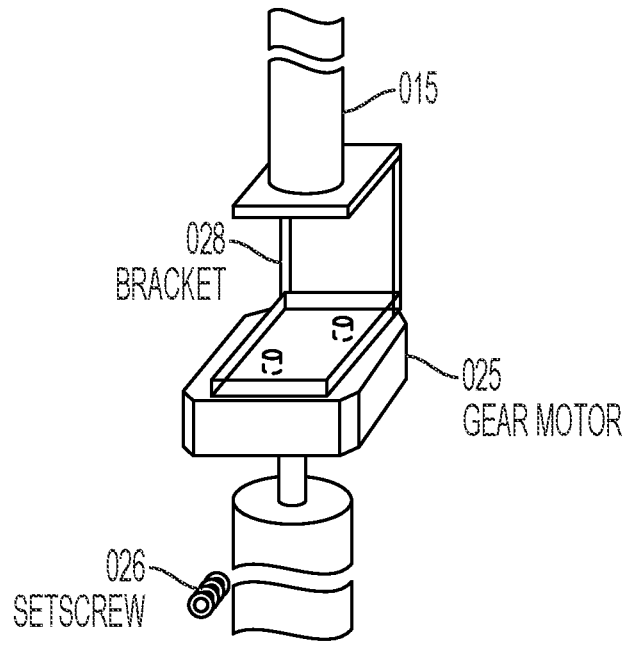
FIG. 5 is a diagram of a rotation mechanism in accordance with one or more embodiments.

Referring now to FIG. 5, a diagram of a rotation mechanism in accordance with one or more embodiments will be discussed. As shown in FIG. 5, a rotation mechanism can attach to the fixed mount 015 with removal pins as shown in FIG. 3. The rotation mechanism also includes a gear motor 025 and bracket 028, and a setscrew 026.

Figure 6:
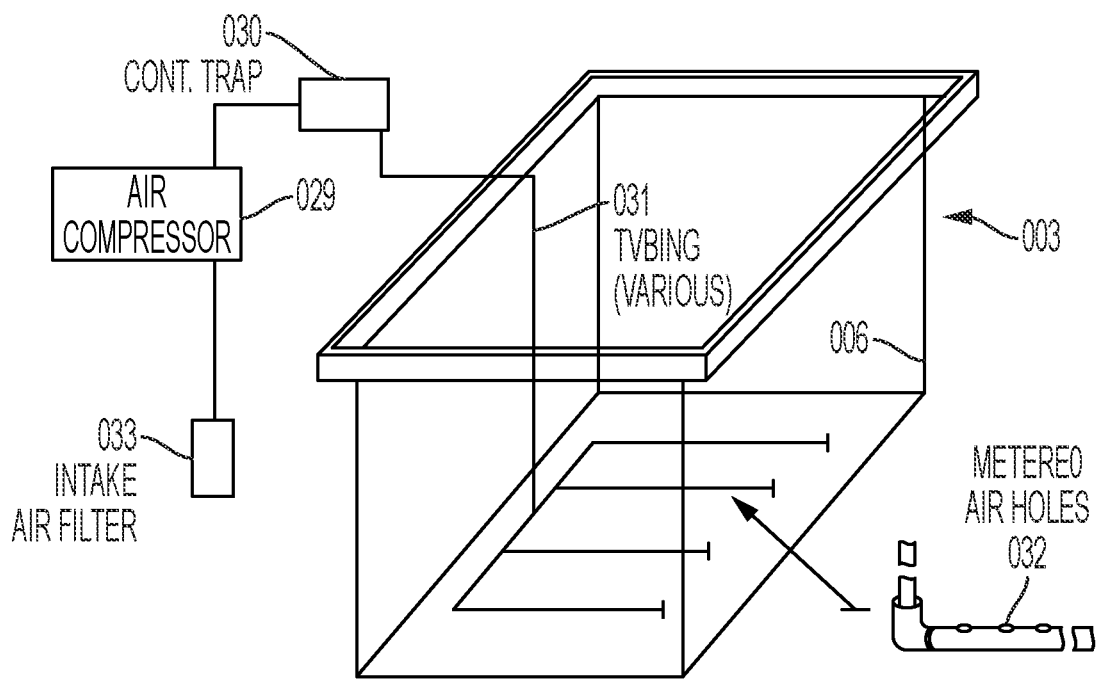
FIG. 6 is a diagram of solution agitation in accordance with one or more embodiments.

Referring now to FIG. 6, a diagram of solution agitation in accordance with one or more embodiments will be discussed. As shown in FIG. 6, a solution agitator can include an air compressor 029 with an intake air filer 033, and trap 030 coupled to tubing 031 that feeds into the solution 006 contained in tank 003 as shown in FIG. 1. The tubing 031 can include metered air holes 032, for example in four submersed tubes one example.

Some agitation of the bath electrolyte solution can be achieved with a plastic-tube manifold at the bottom of the "tank". This manifold, with metered holes over several "legs", allows compressed, and filtered, air to "bubble" up through the solution. This is an apt methodology, but does not limit this scope of the embodiments herein.

In addition to agitation, however, which is accomplished here as well, but as secondary importance, the solution can be filtered by a chemical pump. Multiple methodologies can be employed, but for purposes of this example, all of which have been reduced to practice, a spun polypropylene fiber filter cartridge can be used. These are typically able to remove particulates into the about 0.3 micron to about 0.5 micron range or greater. To enhance the effectiveness of the filter, as well as to add an ability to remove organic contamination, the input side of the polypropylene filter can be partially filled with activated carbon. A variety of other filtrates can be used as well, keeping in mind that they cannot be chemically attacked by the acidic solution or interact with any constituents in the bath. Note that the input side of the pump, and the subsequent filter, is taken from the bottom of the electrolyte container. Following pumping and filtration the "cleaned" electrolyte is re-injected into the bath from the top, thereby achieving all of the aforementioned needs, but also adding to agitation and mixing.

The electrodeposition bath can be heated to the required temperature, and maintained, by a PID-based digital temperature controller which may be connected to a system of public connectivity (SPC) involved network via RS-232 or otherwise. This temperature, and its stability, can be achieved by a variety of options. Titanium encased, or quartz-based, line heaters can be used. Line heaters can also be used. Solid State relays are typically, but not limited to herein, utilized to transfer current from a high amperage source from direct current (DC) or low amperage alternating current (AC) secondaries.

Mechanical and electrical aspects, as well as pre-processing, are disclosed herein in advance of the bath constituents or precursors. Surface area of the substrate's conductive regions is calculated and the aforementioned current-controlled power supply is set to approximately 1.0 ampere (A) to about 1.2 A per decimeter squared (1.0 to 1.2 A/dm$^2$). Glass substrates can be used, although not limiting, as the above mentioned CBD treats only one side, leaving the other insulating and non-conductive.

The process constituents of the bath are delineated below. Note that they have varying degrees of solubility. In addition, it should be noted that the iron deposits preferentially. This involves the Ni metal content, both in solution and in ingot baskets, being much higher than the Fe. In either a development or a manufacturing environment, this requires the use of Statistical Process Control (SPC) techniques. Example bath constituents and other parameters can be as follows:

| | | | | |
|---|---|---|---|---|
| A. | Fes | Iron Sulfide | 6 g/L | Metal Content in Bath = 1.2 g/L |
| B. | NiSO4 | Nickel Sulfate | 218 g/L | Metal Content in Bath = 49 g/L |
| C. | H3BO3 | Boric Acid | 25 g/L | Buffer for pH |
| D. | NaCl | Sodium Chloride | 10 g/L | Helmholtz layer "intensifier" |
| E. | pH | Acidity | 2.7 | |
| F. | NaHCO3 | Balancer | Varies | Used only to raise pH |

Due to the preferential codeposition rate of Fe above that of Ni in the bath, new process "stations" are typically qualified with only iron-containing chemical in the bath. That is, the original starting phase of a new bath to be qualified is without Fe ingots. If Fe ingots are subsequently placed into the bath in their own baskets apart from the Ni, they are done so with a polypropylene "fabric" cover to prevent particulation. This can happen as the Fe decomposes in the chemical environment tiny pieces are ejected and picked up by the agitating solution. They can get deposited onto the substrate and severely interfere with the properties desired of the alloy for sensors. Often the Fe baskets are either placed without anodic charge applied, passive ingots, or are initially placed at a reduced voltage.

It has been determined that total metal concentration of the bath, significantly away from the norms specified herein, lead to preferential deposition of iron and a subsequent loss of the key magnetic permeability of the material. It has been found, however, that an increase by as much as about 25% total metal concentration as atomic percentage in the bath will lead to about a 5% increase in Fe content in the deposited films. It should be noted, however, that the magnetic permeability of the desired material suffers substantially, by as much as −50%, within a range of about +1.5% increase in Fe content in the deposition. It should also be noted that iron concentration as atomic percent in the bath is maintained, by the above recipe and subsequent maintenance, at about 2.4%. A range of about +/−0.2% (3 sigma) should be maintained to prevent the Fe content in the resulting film from deviating substantially from the 20-21% amount in one or more embodiments.

The air-induction mechanical agitation of the bath, through the specified manifold, is a relatively gentle agitation that does not "spit" or case electrolyte out of the container. It is not desirable to the process to have significant extreme agitation in the very near vicinity of the substrates. Not only might they be displaced from their holding fixtures, but the critical Helmholtz layer may be disrupted in the very narrow range of solution at the substrate surface. Some other means of mechanical agitation, such as propellers, etc., can be used, but must be distanced significantly from the region where deposition is occurring. Air filtered for particles and also free of oil and reasonably clean of contaminants is recommended.

The electric current can be the primary electrical measure for success of the process. Too little current density, that is the number of amperes of current per square surface area of substrate, can produce a film which deposits very little nickel, as iron will deposit even without the aid of an electrochemical force. Voltage is modified within the electrochemical cell to achieve the desired current from a current-controlled power supply by voltage modifying devices external to the tank. The electric circuit, completed by the electrolyte between the anode baskets and the substrate cathode, consists of a current-controlled power supply sized to accommodate the number of substrates desired, a set of parallel-oriented power resistors, for example 250 watts (W) each approximately, wiring, and accompanying monitoring devices, either analog or digital current and voltage meters or sensors that may or may not be networked. The power resistors in the circuit lower the overall voltage through a resistive drop to the 2-3 volt (V) range. This can be highly dependent, however, on the physical and chemical makeup of the bath, anodes, cathodes, and other items in the system. Although the current is the critical parameter modulating the voltage not only helps to achieve the desired current density for numbers of substrate of certain total area, but also brings it well below the range where hydrogen and oxygen would be evolved from the aqueous bath.

Other additives may be utilized, such that this document is not limited. However, many additives, typical of "decorative" coatings, so as to relieve metal stresses on the substrate or 'brighteners' can be detrimental to the magnetic permeability of the material. This quantity, of course, can be the critical metric in the success of the sensitivity of a magnetic sensor. As it is well known, however, that complexing agents affect the Helmholtz layer, they can be used to achieve desirable results. These effects can include a greater range of achievement of suitable magnetic permeability and less susceptibility to pH and temperature changes on the morphology of the deposit. The quality of the sensor can depend on not only its magnetic permeability, but also the uniformity of that permeability across the element of the sensor. Complexing agents aid in relaxing the deposition and help avoid stresses which can arise from higher current densities as well. For this reason, another embodiment herein involves the use of either sodium lauryl sulfate at 0.42 grams per liter (g/liter), sodium saccharin at about 0.83 g/liter, or both.

In another embodiment herein, to achieve even higher magnetic permeability, an amount of molybdenum ascorbate is added to achieve approximately 0.3-0.5% molybdenum (Mo) metal atomic percentage in the bath. In this embodiment the Mo displaces some of the Fe and results in a deposition with up to about 2% molybdenum atomic percentage in the sensor alloy. This has been shown to increase the magnetic permeability of the Ni/Fe material of this embodiment by as much as about 19%.

In other embodiments of the foregoing description, other magnetically enhancing materials that can be added in trace amounts depending on their chemical potential and effect on the permeability can include but are not limited to Vanadium, Lanthanum, Gadolinium, Samarium, Cobalt, Europium, Terbium, Ytterbium, Praeseodynium, Neodynium, and so on.

In an additional embodiment herein, a "companion" process to the process described herein is used alternatively and repetitively to deposit not only the desired highly magnetically permeable layers but also a following highly magnetically coercive layer. In this embodiment the magnetically permeable layer is approximately 20-30 times thicker than the coercive layer. These layers are alternated until a thickness has been achieved similar to that of the standard Ni/Fe sensor alloy deposition. The result of this layering is an increased magnetostriction effect, in one dimension, which increases the magnetoresistance of the material for its use in sensors of this type.

In another embodiment herein, the substrates, comprising cathodes, and anodes are subjected to either a square, sawtooth, or arbitrary waveform of alternating current whose average is specified above. The average positive current can be a key value, although the negative amount will naturally be delineated by this adjustment. This AC treatment is an additional methodology to relieve stresses in the deposited films. The frequency of the oscillation can be anywhere from about 1.0 Hz to about 1.0 MHz.

In another embodiment herein, the substrates are bathed in ultrasound in the bath at frequencies from about 20 kilohertz (kHz) to about 100 kHz. This methodology achieves additional mixing at or about the Helmholtz layer.

In a further embodiment herein, the substrates are placed in a relatively uniform magnetic field. This is done by using a strong high current power supply external to the bath arrangement which passes said current through high gauge wires in a coil arrangement to make a solenoidal field. Typically the solenoid is around all of the substrates as they rotate so that they all experience the same uniform magnetic field. The orientation of the substrate and the Helmholtz layer is arranged so that those magnetic atomic species with moments achieve lateral spiral movement in the combination of the electric and magnetic fields presented by this option.

Although the claimed subject matter has been described with a certain degree of particularity, it should be recognized that elements thereof may be altered by persons skilled in the art without departing from the spirit and/or scope of claimed subject matter. It is believed that the subject matter pertaining to highly magnetically permeable alloy deposition method for magnetic sensors and many of its attendant utilities will be understood by the forgoing description, and it will be apparent that various changes may be made in the form, construction and/or arrangement of the components thereof without departing from the scope and/or spirit of the claimed subject matter or without sacrificing all of its material advantages, the form herein before described being merely an explanatory embodiment thereof, and/or further without providing substantial change thereto. It is the intention of the claims to encompass and/or include such changes.

What is claimed is:

1. A method to manufacture a magnetic sensor, comprising:

providing a bath of an electrolyte solution;

providing a substrate, wherein the substrate has a conductive layer deposited on the substrate;

submersing the substrate in the electrolyte solution;

submersing a plurality of ingots in the electrolyte solution, wherein the plurality of ingots comprise nickel ingots and iron ingots; and depositing nickel (Ni) from the nickel ingots and iron from the iron ingots as well as nickel ions and iron ions already in the electrolyte solution on the substrate by applying a voltage between the plurality of ingots and the substrate to form an anisotropic magnetoresistive (AMR) sensor comprising a magnetic alloy layer that is magnetically permeable and magnetoresistive on the substrate;

wherein said depositing nickel and iron comprises depositing a magnetically coercive material on the substrate or on the magnetic alloy layer to provide a stack of alternating magnetically coercive layers, and magnetically permeable and magnetoresistive layers on the substrate;

wherein the conductive layer comprises a low conductivity material; and wherein the electrolyte solution comprises sodium chloride as a Helmholtz layer intensifier at a Helmholtz layer of the substrate to deposit iron as 20 atomic percent to 21 atomic percent of the formed magnetically permeable alloy layer.

2. The method of claim 1, wherein the electrolyte solution has a pH value and comprises constituents as follows:

| | | | |
|---|---|---|---|
| FeS | Iron Sulfide | 6 g/L | Metal Content in the Bath = 1.2 g/L |
| NiSO$_4$ | Nickel Sulfate | 218 g/L | Metal Content in the Bath = 49 g/L |
| H$_3$BO$_3$ | Boric Acid | 25 g/L | Buffer for pH |
| NaCl | Sodium Chloride | 10 g/L | Helmholtz layer "intensifier" |
| pH | Acidity | 2.7 | |
| NaHCO$_3$ | Balancer | | Varies Used to raise pH. |

3. The method of claim 1, wherein nickel and iron are co-deposited on the substrate.

4. The method of claim 1, wherein the magnetic alloy layer deposited on the substrate comprises an alloy material having a relative magnetic permeability greater than a relative magnetic permeability of permalloy up to a relative magnetic permeability of 112,120+/−125.

5. The method of claim 1, wherein the substrate comprises phosphorous doped silicon.

6. The method of claim 1, wherein the substrate comprises glass.

7. The method of claim 6, further comprising etching the glass substrate to micro-roughen a surface of the glass substrate prior to submersing the substrate in the electrolyte solution.

8. The method of claim 1, further comprising rotating the substrate during said depositing nickel and iron on the substrate.

9. The method of claim 1, further comprising agitating the electrolyte solution during said depositing nickel and iron on the substrate to provide mixing of nickel and iron precursor reactants at the Helmholtz layer of the substrate.

10. The method of claim 9, wherein said agitating comprises injecting the electrolyte solution with air bubbles.

11. The method of claim 1, wherein the electrolyte solution comprises a pH buffer or balancer.

12. The method of claim 2, wherein some of the plurality of ingots further comprise molybdenum, vanadium, lanthanum, gadolinium, samarium, cobalt, europium, terbium, ytterbium, praseodymium, or neodymium.

13. The method of claim 1, wherein the magnetically permeable and magnetoresistive layers are 20 to 30 times thicker than the magnetically coercive layers.

14. The method of claim 1, further comprising applying a magnetic field to the substrate during said depositing the nickel and iron.

15. The method of claim 1, further comprising applying an ultrasound signal to the substrate during said depositing the nickel and iron, wherein the ultrasound signal has a frequency from 20 kilohertz (kHz) to 100 kHz to facilitate mixing of the nickel and iron at the Helmholtz layer.

16. The method of claim 1, further comprising applying a resist material to the substrate before submersing the substrate in the electrolyte solution, wherein the nickel and iron are deposited on a region of the substrate free of the resist material.

17. The method of claim 1, wherein the substrate comprises a flexible material.

* * * * *